(12) United States Patent  
Rho

(10) Patent No.: US 9,171,611 B2  
(45) Date of Patent: Oct. 27, 2015

(54) NONVOLATILE MEMORY APPARATUS AND OPERATING METHOD THEREOF

(71) Applicant: SK HYNIX INC., Icheon (KR)

(72) Inventor: Jun Rye Rho, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/310,889

(22) Filed: Jun. 20, 2014

(65) Prior Publication Data

US 2015/0235697 A1    Aug. 20, 2015

(30) Foreign Application Priority Data

Feb. 19, 2014  (KR) .................. 10-2014-0018868

(51) Int. Cl.
*G11C 7/22* (2006.01)
*G11C 11/56* (2006.01)
*G11C 7/00* (2006.01)

(52) U.S. Cl.
CPC . *G11C 11/56* (2013.01); *G11C 7/00* (2013.01)

(58) Field of Classification Search
CPC .. G06F 12/00; G06F 2212/2022; G11C 16/10
USPC ........................................ 365/189.16, 185.18
See application file for complete search history.

(56) References Cited

U.S. PATENT DOCUMENTS

| 5,229,972 | A  | * | 7/1993 | Kondo et al. ............ 365/185.11 |
| 7,171,528 | B2 | * | 1/2007 | Evans et al. .................... 365/120 |
| 2007/0064461 | A1 | * | 3/2007 | Srinivasan et al. .............. 365/49 |
| 2012/0243304 | A1 | * | 9/2012 | Hoya ............................ 365/158 |
| 2013/0010550 | A1 | * | 1/2013 | Kim et al. ................ 365/189.15 |
| 2015/0106560 | A1 | * | 4/2015 | Perego et al. .................. 711/105 |

FOREIGN PATENT DOCUMENTS

KP   10-2012-0028035 A   3/2012

* cited by examiner

*Primary Examiner* — Tuan T Nguyen

(57) ABSTRACT

A method operates a nonvolatile memory apparatus. The method includes performing a first write operation to store first data in first to third memory cells; and performing a second write operation to store second data in the first to third memory cells in which the first data has been stored, wherein, as a result of the first write operation and the second write operation, each of the first to third memory cells has one of first to third states.

20 Claims, 6 Drawing Sheets

NONVOLATILE MEMORY APPARATUS AND OPERATING METHOD THEREOF

CROSS-REFERENCES TO RELATED APPLICATION

The present application claims priority under 35 U.S.C. §119(a) to Korean Patent Application Number 10-2014-0018868, filed on Feb. 19, 2014, in the Korean Intellectual Property Office, which is incorporated herein by reference in its entirety.

BACKGROUND

1. Technical Field

Various embodiments relate to a nonvolatile memory apparatus, and more particularly, to an apparatus and a method for storing data in a memory cell.

2. Related Art

A nonvolatile memory device may retain stored data even though power is turned off. Nonvolatile memory devices include a flash memory devices such as NAND flash or NOR flash memory devices, FRAM (ferroelectric random access memory) devices, PRAM (phase-change random access memory) devices, MRAM (magnetic random access memory) devices, and RRAM (resistive random access memory) devices.

SUMMARY

In an embodiment of the present invention, a method for operating a nonvolatile memory apparatus may include: performing a first write operation to store first data in first to third memory cells; and performing a second write operation to store second data in the first to third memory cells in which the first data has been stored, wherein, as a result of the first write operation and the second write operation, each of the first to third memory cells has one of first to third states.

In an embodiment of the present invention, a nonvolatile memory apparatus may include a plurality of memory cells including first to third memory cells, an encoder configured to encode first data into first write data and then encode second data into second write data, and a control logic configured to control states of the first to third memory cells based on the first write data and control the states of the first to third memory cells based on the second write data, wherein each of the first and second write data has bits corresponding to the first to third memory cells, and wherein each of the first to third memory cells has one of first to third states after the states of the first to third memory cells are controlled based on the first and second write data.

BRIEF DESCRIPTION OF THE DRAWINGS

Features, aspects, and embodiments of the present disclosure will be described in conjunction with the attached drawings, in which.

DETAILED DESCRIPTION

Hereinafter, a nonvolatile memory apparatus and an operating method thereof according to embodiments of the present disclosure will be described with reference to the accompanying drawings.

Figure 1:
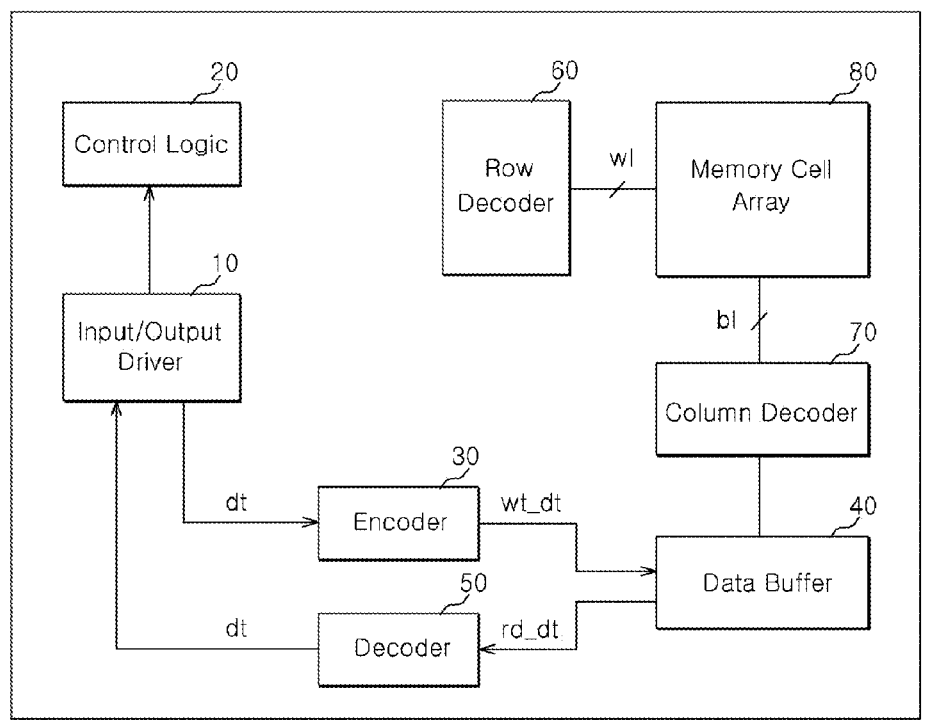
FIG. 1 illustrates a block diagram of a nonvolatile memory apparatus in accordance with an embodiment.
Figure 1:
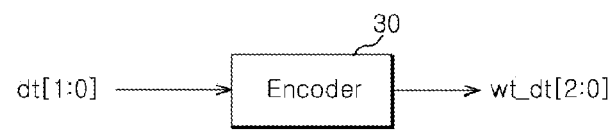
Figure 1:
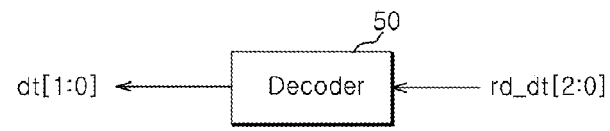

FIG. 1 illustrates a block diagram of a nonvolatile memory apparatus 100 in accordance with an embodiment.

The nonvolatile memory apparatus 100 includes an input/output driver 10, a control logic 20, an encoder 30, a data buffer 40, a decoder 50, a row decoder 60, a column decoder 70, and a memory cell array 80.

The input/output driver 10 transmits various control signals and data inputted from an external device (not shown). to internal circuits of the memory apparatus 100 such as the control logic 20 and the encoder 30. The input/output driver 10 transmits data read out of the memory cell array 80 to an external device.

The control logic 20 controls operations of the nonvolatile memory apparatus 100. For example, the control logic 20 controls write/read/erase operations for the memory cell array 80. In order to control the write/read/erase operations, the control logic 20 receives external commands from an external device via the input/output driver 10.

The encoder 30 encodes data dt received from an external device and generates write data wt_dt. In an embodiment, the encoder 30 encodes the data dt by units of M bits. That is, the encoder 30 encodes M-bit data dt[M−1:0] and generates N-bit write data wt_dt[N−1:0]. Herein, M and N are positive integers, and N is greater than M. In an embodiment, M is 2, and N is 3. However, embodiments are not limited thereto. That is, in another embodiment, the data dt has more than 2 bits, and the encoder 30 generates write data having more than 3 bits based on the data dt having more than 2 bits. For convenience of illustration, the present disclosure describes embodiments in which M is 2 and N is 3.

The data buffer 40 receives the write data wt_dt from the encoder 30. The data buffer 40 temporarily stores the transmitted write data wt_dt before the write data wt_dt is stored in the memory cell array 80. Also, the data buffer 40 transmits read data rd_dt, which is read out of the memory cell array 80, to the decoder 50.

The decoder 50 decodes the read data rd_dt and generates the data dt. In an embodiment, the decoder 50 decodes read data rd_dt by units of 3 bits. That is, the decoder 50 decodes 3-bit read data rd_dt[2:0] and generates 2-bit data dt[1:0].

The row decoder 60 is electrically coupled to the memory cell array 80 via a plurality of word lines wl. The row decoder 60 controls the activation of the word lines wl to store and read data in and from the memory cell array 80.

The column decoder 70 is electrically coupled with the memory cell array 80 via a plurality of bit lines bl. The column decoder 70 controls the activation of the bit lines bl to store and read data in and from the memory cell array 80.

The memory cell array 80 includes a plurality of memory cells. Data may be stored in each of the memory cells. When a memory cell is a single level cell (SLC), 1 bit data may be stored in the memory cell. When a memory cell is a multi-level cell (MLC), 2 or more bit data may be stored in the memory cell.

Figure 2:
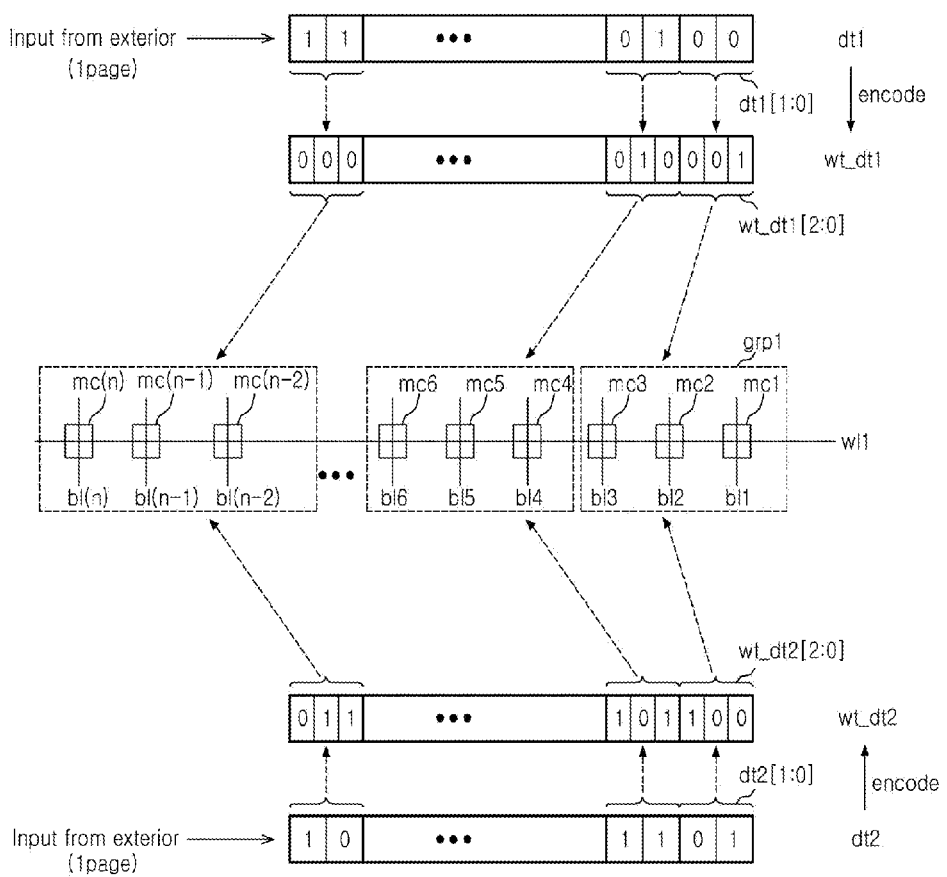
FIG. 2 illustrates a process of storing data in memory cells included in a memory cell array shown in FIG. 1.

FIG. 2 illustrates a process of storing first data dt1 and second data dt2 in memory cells mc1 to mc(n) included in the memory cell array 80 shown in FIG. 1. Herein, n is a positive integer. The process of FIG. 2 will be described with reference to FIG. 1.

A number of bits of the first data dt1 is the same as a number of bits of the second data dt2 and smaller than a number of the memory cells mc1 to mc(n), and a sum of the number of bits of the first data dt1 and the number of bits of the second data dt2 is greater than the number of memory cells mc1 to mc(n).

The memory cells mc1 to mc(n) are electrically coupled with a first word line wl1. Each of the memory cells mc1 to mc(n) is electrically coupled with a corresponding one of bit lines bl1 to bl(n). That is to say, the memory cells mc1 to mc(n) are disposed at cross points, i.e., regions where the first word line wl1 and the bit lines bl1 to bl(n) cross each other, respectively.

Each of the memory cells mc1 to mc(n) has a state that is changed by the activation of the word line wl1 and a corresponding one of the bit lines bl1 to bl(n). The change in the state of a memory cell may cause a change in a threshold voltage of the memory cell. The memory cells mc1 to mc(n) may each be in a different state depending on the data stored therein. The data stored in the memory cells mc1 to mc(n) are read out by detecting the different states of the memory cells mc1 to mc(n).

The nonvolatile memory apparatus 100 may perform write/read operations for the memory cell array 80 by units of a page. In the write/read operations for one page, one word line may be activated.

The nonvolatile memory apparatus 100 may receive the first data dt1 corresponding to a page. The nonvolatile memory apparatus 100 performs a first write operation to store the first data dt1 in the memory cells mc1 to mc(n) coupled to the first word line wl1. The nonvolatile memory apparatus 100 performs the first write operation in such a manner that 2 bits are stored in 3 memory cells.

In detail, the encoder 30 encodes the first data dt1 by units of 2 bits and outputs first write data wt_dt1. For example, the encoder 30 generates first write data wt_dt1[2:0] of 3 bits by encoding lower 2 bits dt1[1:0] of the first data dt1. After that, the control logic 20 controls respective states of the first to third memory cells mc1 to mc3 so that they change or remain the same based on the first write data wt_dt1[2:0]. As a result, the first data dt1[1:0] of 2 bits is stored in the first to third memory cells mc1 to mc3.

After that, the nonvolatile memory apparatus 100 may receive the second data dt2 by units of a page. The nonvolatile memory apparatus 100 performs a second write operation to also store the second data dt2 in the memory cells mc1 to mc(n) coupled to the first word line wl1. The nonvolatile memory apparatus 100 performs the second write operation in such a manner that the 2-bit second data are stored in the 3 memory cells in which the 2-bit first data has also been stored.

In detail, the encoder 30 encodes the second data dt2 by units of 2 bits and outputs second write data wt_dt2. For example, the encoder 30 generates second write data wt_dt2[2:0] of 3 bits by encoding lower 2 bits dt2[1:0] of the second data dt2. The control logic 20 controls the respective states of the first to third memory cells mc1 to mc3 so that they change or remain the same based on the second write data wt_dt2[2:0]. As a result, the second data dt2[1:0] of 2 bits are stored in the first to third memory cells mc1 to mc3 in which the first data dt1[1:0] has also been stored.

For illustrative convenience, the memory cells mc1 to mc(n) are grouped into a plurality of cell groups, each of which includes 3 memory cells. In the respective cell groups, 2-bit first data and 2-bit second data may be stored.

Hereinafter, a method of operating the nonvolatile memory apparatus 100 in accordance with an embodiment will be described with reference to FIGS. 1 and 2. In a method in accordance with an embodiment, first data dt1[1:0] of 2 bits and second data dt2[1:0] of 2 bits, that is, a total of 4 bits, are stored in a first cell group grp1 including the first to third memory cells mc1 to mc3. The operating method described below may be applied in substantially the same manner to the remaining cell groups including the memory cells mc4 to mc(n).

Figure 3:
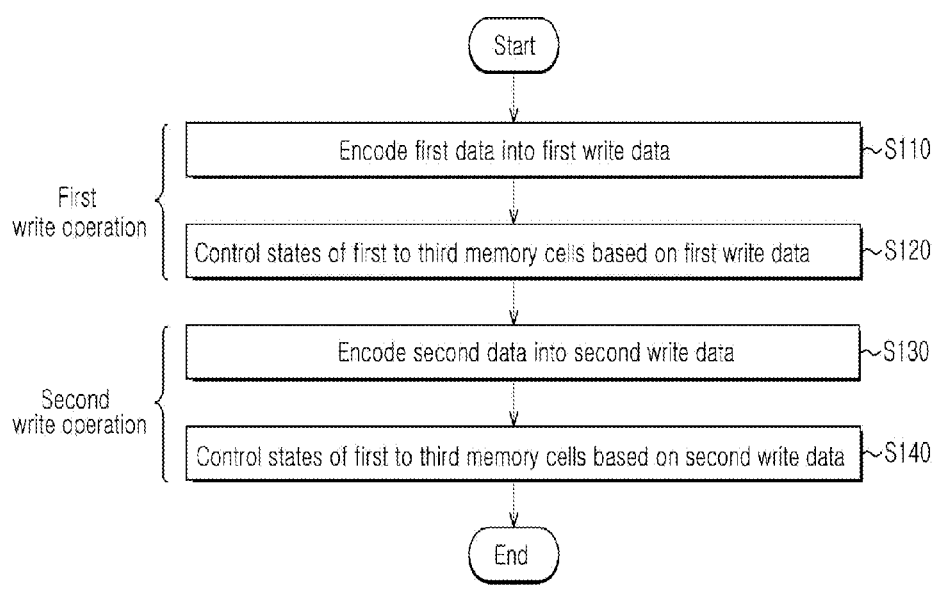
FIG. 3 is a flow chart illustrating a write operation of the nonvolatile memory apparatus shown in FIG. 1.

FIG. 3 is a flow chart illustrating a write operation of the nonvolatile memory apparatus 100 shown in FIG. 1. FIG. 3 shows a process of performing a first write operation for storing first data of 2 bits in first to third memory cells and a second write operation for additionally storing second data of 2 bits in the first to third memory cells.

Figure 4:
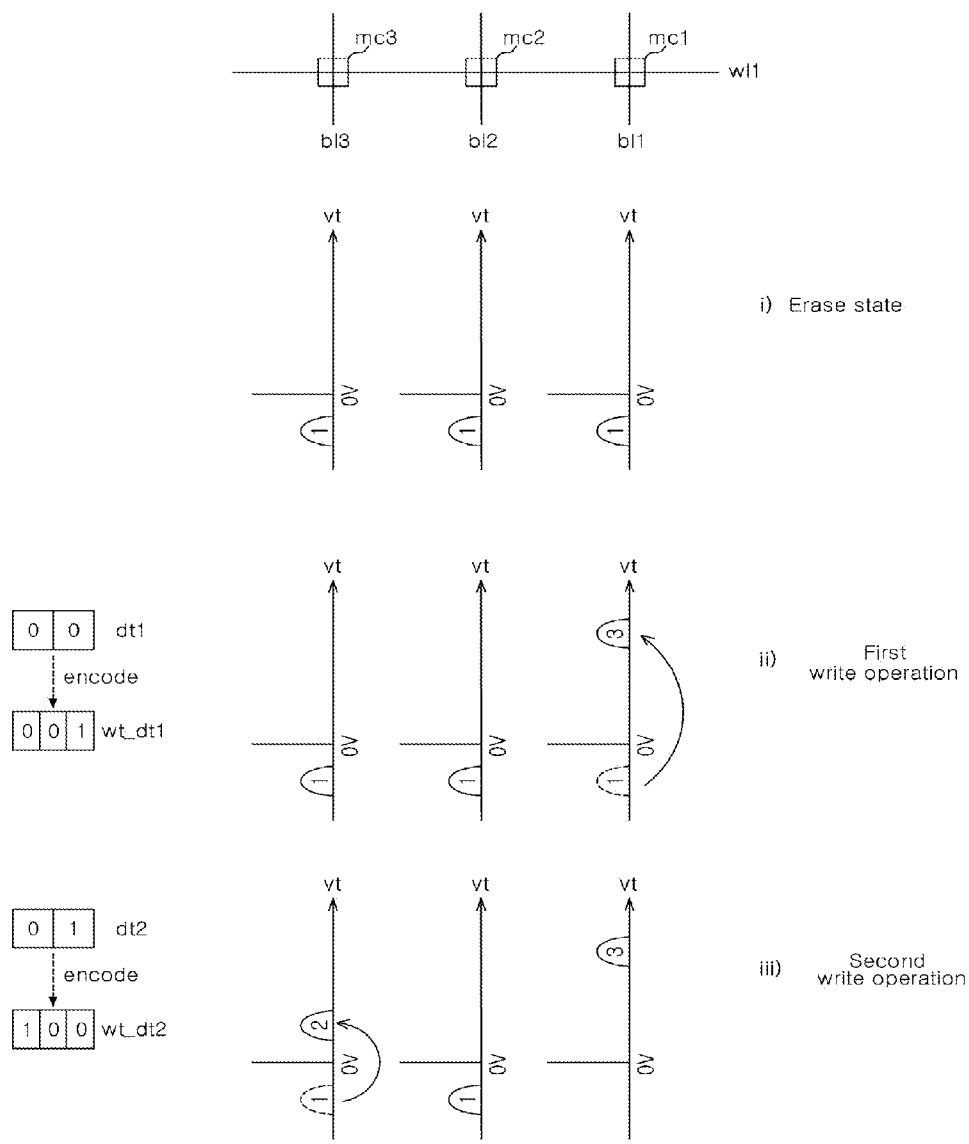
FIGS. 4 (*i*) to (*iii*) illustrate a process of performing the write operation shown in FIG. 3.

FIGS. 4 (i) to (iii) are diagrams illustrating a process of performing the write operations shown in FIG. 3 in accordance with an embodiment. FIGS. 4 (i) to (iii) describe the first to third memory cells mc1 to mc 3 in an erase state, states of the first to third memory cells mc1 to mc 3 after the first write operation is performed, and states of the first to third memory cells mc1 to mc 3 after the second write operation is performed, respectively. FIGS. 4 (i) to (iii) show a process of sequentially storing the first data dt1[1:0] having a bit value '00' and the second data dt2[1:0] having a bit value '01' in the first to third memory cells mc1 to mc3.

Referring to FIG. 4, by performing the first write operation and the second write operation, threshold voltages of the first to third memory cells mc1 to mc3 change as respective states of the first to third memory cells mc1 to mc3 change based on the bit value '00' of the first data dt1[1:0] and the bit value '01' of the second data dt2[1:0]. Each of the first to third memory cells mc1 to mc3 may be in one of first to third states according to the data stored therein. A memory cell in the third state '3' may have the highest threshold voltage. A memory cell in the first state '1' may have the lowest threshold voltage. A memory cell in the second state '2' may have an intermediate threshold voltage between the highest threshold voltage and the lowest threshold voltage. In an embodiment, a memory cell in the first state has a threshold voltage lower than 0V, and the first state is an erase state.

Hereafter, write operations of the nonvolatile memory apparatus 100 will be described in detail with reference to FIGS. 3 and 4.

Before an initial write operation is performed, it is assumed that the first to third memory cells mc1 to mc3 are initialized in the first state, that is, in the erase state.

In step S110, if the first data dt1 is provided, the encoder 30 encodes the first data dt1 of 2 bits into the first write data wt_dt1 of 3 bits. The encoder 30 may generate the first write data wt_dt1 based on the first data dt1, as presented in the following Table 1.

TABLE 1

First data encoding result

| | \multicolumn{12}{c}{dt1} |
| | 00 | | | 01 | | | 10 | | | 11 | | |
|---|---|---|---|---|---|---|---|---|---|---|---|---|
| wt_dt1 | 0 | 0 | 1 | 0 | 1 | 0 | 1 | 0 | 0 | 0 | 0 | 0 |
| Memory cell | mc3 | mc2 | mc1 | mc3 | mc2 | mc1 | mc3 | mc2 | mc1 | mc3 | mc2 | mc1 |

Accordingly, the encoder 30 encodes the first data dt1 having a bit value '00' into the first write data wt_dt1 having a bit value '001'.

In step S120, the control logic 20 controls states of the first to third memory cells mc1 to mc3 based on the first write data wt_dt1. The control logic 20 may control the states of the first to third memory cells mc1 to mc3 so that they are changed or remain the same depending on the bit value of the first write data wt_dt1.

Respective bits of the first write data wt_dt1 may be stored in the respective first to third memory cells mc1 to mc3. For example, as presented in Table 1, when first data dt1 has the bit value '00', wt_dt1[0] having a bit value '1' is stored in the first memory cell mc1, wt_dt1[1] having a bit value '0' is stored in the second memory cell mc2, and wt_dt1[2] having a bit value '0' is stored in the third memory cell mc3.

When the first write data wt_dt1 has a bit value '0', the control logic 20 controls a state of a corresponding memory cell to remain as it is. That is, the memory cell maintains its initial state, i.e., the first state '1'. When the first write data wt_dt1 has a bit value '1', the control logic 20 controls a state of a corresponding memory cell so that it changes from the initial state, i.e., the first state '1', to the third state '3'. In other words, in FIG. 4, since the first write data wt_dt1[0] has a bit value '1', the state of the first memory cell mc1 is changed from the first state '1' to the third state '3'. Since the first write data wt_dt1[1] has a bit value '0', the second memory cell mc2 remains in the first state '1'. Since the first write data wt_dt1[2] has a bit value '0', the third memory cell mc3 remains in the first state '1'. In this way, the first data dt1 having the bit value '00' is stored in the first to third memory cells mc1 to mc3 using the first write data wt_dt1 having the bit value '001'.

Referring back to FIG. 3, in step S130, if second data dt2 is provided, the encoder 30 encodes the second data dt2 of 2 bits into the second write data wt_dt2 of 3 bits. The encoder 30 may generate the second write data wt_dt2 based on the second data dt2 and the first data dt1 as presented in the following Table 2.

That is, the encoder 30 encodes the second data dt2 into the second write data wt_dt2 based on the first data dt1. The encoder 30 encodes the second data dt2 by referring to the first data dt1, which has been stored in the first to third memory cells mc1 to mc3. Thus, the encoder 30 encodes second data dt2 having the same bit value differently depending on a bit value of the first data dt1 stored in the first to third memory cells mc1 to mc3. For example, when first data dt1 having a bit value '00' has been stored in the first to third memory cells mc1 to mc3, the encoder 30 encodes second data dt2 having a bit value '01' into second write data wt_dt2 having a bit value '100'. On the other hand, when first data dt1 having a bit value '01' has been stored in the first to third memory cells mc1 to mc3, the encoder 30 encodes the second data dt2 having the bit value '01' into second write data wt_dt2 having a bit value '000'. That is, even though the second data dt2 has the same bit value '01', the encoder 30 generates the second write data wt_dt2 having bit values '100' and '000' based on the bit values '00' and '01' of the first data dt1, respectively.

In step S140, the control logic 20 controls the states of the first to third memory cells mc1 to mc3 based on the second write data wt_dt2. Bits of the second write data wt_dt2 may respectively correspond to the first to third memory cells mc1 to mc3, and accordingly, the control logic 20 controls the states of the first to third memory cells mc1 to mc3. As a result, the states of the first to third memory cells mc1 to mc3 are changed or remain the same based on the bit value of the second write data wt_dt2.

In detail, when the second write data wt_dt2 has a bit value '0', the control logic 20 controls a state of a corresponding memory cell so that it remains as it is. When the second write data wt_dt2 has a bit value '1', the control logic 20 controls a state of a corresponding memory cell so that it changes from an initial state, i.e., the first state '1', to the second state '2'. In other words, in FIG. 4, since the second write data wt_dt2[0] has a bit value '0', the first memory cell mc1 retains its previous state, i.e., the third state '3'. Since the second write data wt_dt2[1] has a bit value '0', the second memory cell mc2 retains its previous state, i.e., the first state '1'. Since the second write data wt_dt2[2] has a bit value '1', the state of the third memory cell mc3 is changed from the first state '1' to the second state '2'. In this way, the second data dt2 having the bit value '01' is additionally stored in the first to third memory cells mc1 to mc3.

TABLE 2

Second data encoding result

| | | \multicolumn{12}{c}{dt1} |
| | dt2 | 00 | | | 01 | | | 10 | | | 11 | | |
|---|---|---|---|---|---|---|---|---|---|---|---|---|---|
| wt_dt2 | 00 | 0 | 0 | 0 | 1 | 0 | 0 | 0 | 1 | 0 | 1 | 1 | 0 |
| | 01 | 1 | 0 | 0 | 0 | 0 | 0 | 0 | 0 | 1 | 1 | 0 | 1 |
| | 10 | 0 | 1 | 0 | 0 | 0 | 1 | 0 | 0 | 0 | 0 | 1 | 1 |
| | 11 | 1 | 1 | 0 | 1 | 0 | 1 | 0 | 1 | 1 | 0 | 0 | 0 |
| Memory cell | | mc3 | mc2 | mc1 | mc3 | mc2 | mc1 | mc3 | mc2 | m1 | mc3 | mc2 | mc1 |

Table 3 shows the states of the first to third memory cells mc1 to mc3 based on the stored first data dt1 and second data dt2 (shaded) as results of performing a first write operation and a second write operation in accordance with an embodiment. Table 3 shows the states of the first to third memory cells mc1 to mc3 when the first data dt1 and the second data dt2 are encoded according to Table 1 and Table 2 and stored in the first to third memory cells mc1 to mc3.

TABLE 3

States of memory cells according to stored first data and second data

| dt1 | | 00 | | | 01 | | | 10 | | | 11 | |
|---|---|---|---|---|---|---|---|---|---|---|---|---|
| First write operation | 1 | 1 | 3 | 1 | 3 | 1 | 3 | 1 | 1 | 1 | 1 | 1 |
| Second write 00 | 1 | 1 | 3 | 2 | 3 | 1 | 3 | 2 | 1 | 2 | 2 | 1 |
| Operation 01 | 2 | 1 | 3 | 1 | 3 | 1 | 3 | 1 | 2 | 2 | 1 | 2 |
| 10 | 1 | 2 | 3 | 1 | 3 | 2 | 3 | 1 | 1 | 1 | 2 | 2 |
| 11 | 2 | 2 | 3 | 2 | 3 | 2 | 3 | 2 | 2 | 1 | 1 | 1 |
| Memory cell | mc3 | mc2 | mc1 | mc3 | mc2 | mc1 | mc3 | mc2 | mc1 | mc3 | mc2 | mc1 |

The first to third memory cells mc1 to mc3 have states changing depending on the first data dt1 and second data dt2 stored therein.

When the first write operation is performed to store the first data dt1 in the first to third memory cells mc1 to mc3, a state of each of the first to third memory cells mc1 to mc3 is changed from the initial first state '1' to the third state '3' or remains in the initial first state '1'. When the first write operation is performed, a state of any one of the first to third memory cells mc1 to mc3 is changed from the initial first state '1' to the third state '3' or remains in the initial first state '1'. For example, if the first data dt1 has one of bit values '00', '01' and '10', any one of the first to third memory cells mc1 to mc3 may have the third state '3'. If the first data dt1 has a bit value '11', the first to third memory cells mc1 to mc3 retain the initial first state '1'.

After that, when the second write operation is performed, a state of one of the first to third memory cells mc1 to mc3, which was changed from the initial state '1' to the third state '3' as a result of the first write operation, continuously remains in the third state '3'. When the second write operation is performed to store the second data dt2 in the first to third memory cells mc1 to mc3, a state of at least one of the first to third memory cells mc1 to mc3 that is in the first state '1' is changed to the second state '2', or remains the same, i.e., in the first state '1'. For example, assuming that the first data dt1 has a bit value '00' and the second data dt2 has a bit value '00', the second memory cell mc2 and the third memory cell mc3 remain in the first state '1', and the first memory cell mc1 remains in the third state '3'. On the other hand, if the first data dt1 has the bit value '00' and the second data dt2 has one of the bit values '01', '10' or '11', a state of at least one of the second memory cell mc2 and the third memory cell mc3 is changed from the first state '1' to the second state '2'.

As described above with reference to FIGS. 1 to 4, in accordance with an embodiment, 2 bits of the first data dt1 and 2 bits of the second data dt2, i.e., a total of 4 bits, are stored in three memory cells.

Figure 5:
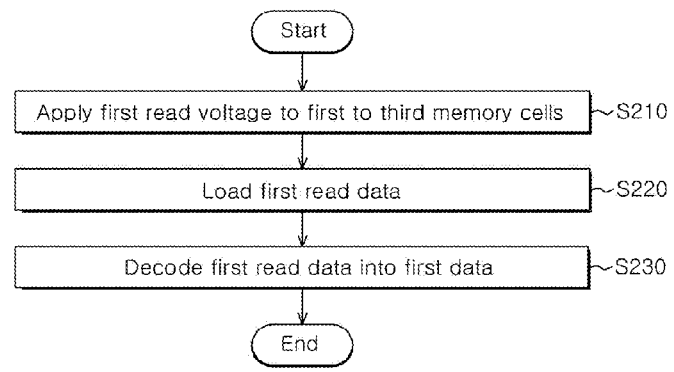
FIG. 5 is a flow chart illustrating a first read operation of the nonvolatile memory apparatus shown in FIG. 1.

FIG. 5 is a flow chart explaining a first read operation of the nonvolatile memory apparatus 100 shown in FIG. 1. In FIG. 5, a process of reading out the first data dt1 stored in the first to third memory cells mc1 to mc3 is shown.

Figure 6:
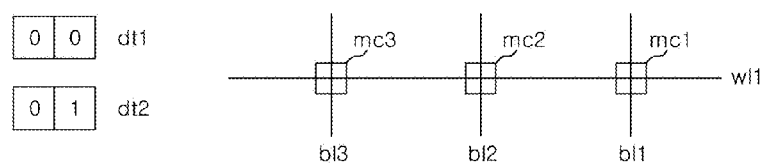
FIG. 6 illustrates a read data loading process of the first read operation shown in FIG. 5.
Figure 6:
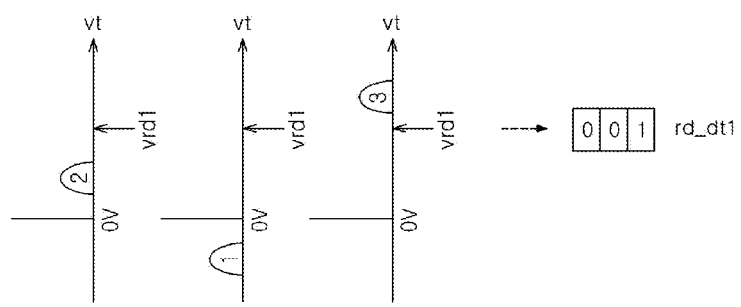

FIG. 6 illustrates a read data loading process of the first read operation shown in FIG. 5. FIG. 6 shows the case in which first data dt1[1:0] having a bit value '00' and second data dt2[1:0] having a bit value '01' are stored in the first to third memory cells mc1 to mc3. In this case, the first to third memory cells mc1 to mc3 may be in the third state '3', the first state '1' and the second state '2', respectively, as shown in Table 3.

Hereafter, the first read operation of the nonvolatile memory apparatus 100 will be described in detail with reference to FIGS. 5 and 6.

In step S210, a first read voltage vrd1 is applied to the first to third memory cells mc1 to mc3 according to the control of the control logic 20. The first read voltage vrd1 may be higher than a threshold voltage of a memory cell in the second state '2' and may be lower than a threshold voltage of a memory cell in the third state '3'.

In step S220, first read data rd_dt1 is loaded on the data buffer 40 from the first to third memory cells mc1 to mc3. Referring to FIG. 6, as a result of applying a first read voltage vrd1 to the first to third memory cells mc1 to mc3, first read data rd_dt1 having a bit value '001' may be loaded in the data buffer 40.

Referring back to FIG. 5, in step S230, the decoder 50 decodes the first read data rd_dt1 into first data dt1. The decoder 50 generates the first data dt1 having a bit value '00' when the first read data rd_dt1 has the bit value '001'.

Results of the first read operation may be arranged as in Table 4. Table 4 shows a bit value of the first read data rd_dt1, which is loaded in the data buffer 40 according to a bit value of the first data dt1 stored in the first to third memory cells mc1 to mc3, when the first read voltage vrd1 is applied to the first to third memory cells mc1 to mc3.

TABLE 4

First read data loaded in data buffer when first read voltage is applied

| | dt1 | | | | | | | | | | | |
|---|---|---|---|---|---|---|---|---|---|---|---|---|
| | 00 | | | 01 | | | 10 | | | 11 | | |
| rd_dt1 | 0 | 0 | 1 | 0 | 1 | 0 | 1 | 0 | 0 | 0 | 0 | 0 |
| Memory cell | mc3 | mc2 | mc1 | mc3 | mc2 | mc1 | mc3 | mc2 | mc1 | mc3 | mc2 | mc1 |

Table 4 shows the first read data rd_dt1 loaded in the data buffer 40 when the first data dt1 has been encoded as presented in Table 1 and stored in the first to third memory cells mc1 to mc3. The first read data rd_dt1 of Table 4 may be inferred from the states of the first to third memory cells mc1 to mc3 shown in Table 3. The first read data rd_dt1 may be outputted as predetermined values corresponding to the first data dt1, regardless of whether the second data dt2 has been stored or not and regardless of a bit value of the second data dt2. The first read data rd_dt1 is outputted by applying the first read voltage vrd1 to the first to third memory cells mc1 to mc3. As a result, the first read data rd_dt1 may be decoded into the first data dt1 as shown in Table 4.

Figure 7:
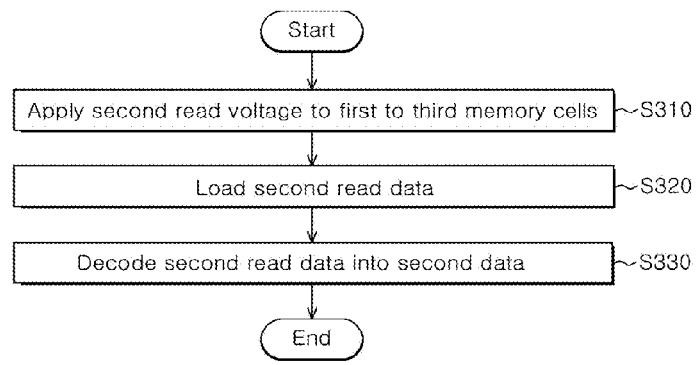
FIG. 7 is a flow chart illustrating a second read operation of the nonvolatile memory apparatus shown in FIG. 1.

FIG. 7 is a flow chart explaining a second read operation of the nonvolatile memory apparatus 100 shown in FIG. 1. In FIG. 7, a process of reading out second data dt2 stored in the first to third memory cells mc1 to mc3 is shown.

Figure 8:
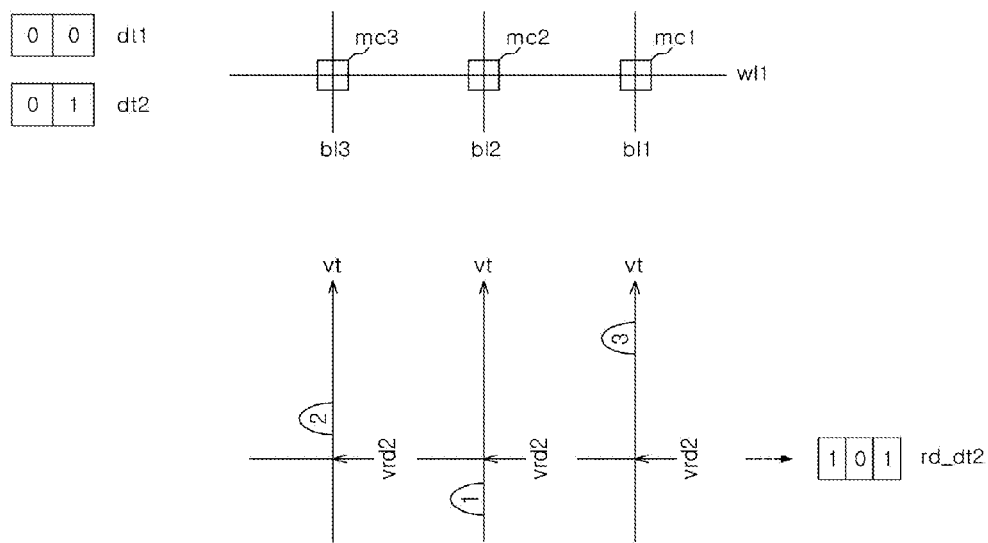
FIG. 8 illustrates a read data loading process of the second read operation shown in FIG. 7.

FIG. 8 illustrates a read data loading process of the second read operation shown in FIG. 7. FIG. 8 shows the case in which first data dt1[1:0] having a bit value '00' and second data dt2[1:0] having a bit value '01' are stored in the first to third memory cells mc1 to mc3.

Hereafter, the second read operation of the nonvolatile memory apparatus 100 will be described in detail with reference to FIGS. 7 and 8.

In step S310, a second read voltage vrd2 is applied to the first to third memory cells mc1 to mc3 according to the control of the control logic 20. The second read voltage vrd2 may be higher than a threshold voltage of a memory cell in the first state '1' and may be lower than a threshold voltage of a memory cell in the second state '2'. In an embodiment, the second read voltage has 0V.

In step S320, second read data rd_dt2 is loaded in the data buffer 40 from the first to third memory cells mc1 to mc3. Referring to FIG. 8, as a result of applying a second read voltage vrd2 to the first to third memory cells mc1 to mc3, second read data rd_dt2 having a bit value '101' may be loaded in the data buffer 40.

Referring back to FIG. 7, in step S330, the decoder 50 decodes the second read data rd_dt2 into second data dt2. The decoder 50 generates the second data dt2 having a bit value '01' when the second read data rd_dt2 has the bit value '101'.

Results of the second read operation may be arranged as shown in Table 5. Table 5 shows a bit value of the second read data rd_dt2 which is loaded in the data buffer 40 according to a bit value of the second data dt2 stored in the first to third memory cells mc1 to mc3, when the second read voltage vrd2 is applied to the first to third memory cells mc1 to mc3.

TABLE 5

Second read data loaded in data buffer when second read voltage is applied

| | | dt1 | | | | | | | | | | | |
|---|---|---|---|---|---|---|---|---|---|---|---|---|---|
| | dt2 | 00 | | | 01 | | | 10 | | | 11 | | |
| rd_dt2 | 00 | 0 | 0 | 1 | 1 | 1 | 0 | 1 | 1 | 0 | 1 | 1 | 0 |
| | 01 | 1 | 0 | 1 | 0 | 1 | 0 | 1 | 0 | 1 | 1 | 0 | 1 |
| | 10 | 0 | 1 | 1 | 0 | 1 | 1 | 1 | 0 | 0 | 0 | 1 | 1 |
| | 11 | 1 | 1 | 1 | 1 | 1 | 1 | 1 | 1 | 1 | 0 | 0 | 0 |
| Memory cell | | mc3 | mc2 | mc1 | mc3 | mc2 | mc1 | mc3 | mc2 | mc1 | mc3 | mc2 | Mc1 |

Table 5 shows the second read data rd_dt2 loaded on the data buffer 40 when the second data dt2 has been encoded as presented in Table 2 and stored in the first to third memory cells mc1 to mc3. The second read data rd_dt2 of Table 5 may be inferred from the states of the first to third memory cells mc1 to mc3 shown in Table 3. The second read data rd_dt2 may be outputted as predetermined values corresponding to the second data dt2. The second read data rd_dt2 is outputted by applying the second read voltage vrd2 to the first to third memory cells mc1 to mc3. As a result, the second read data rd_dt2 may be decoded into the second data dt2 as shown in Table 5.

As is apparent from the above descriptions, since 2 bits of first data dt1 and 2 bits of second data dt2, i.e., a total of 4 bits of information, are stored in three memory cells, the nonvolatile memory apparatus in accordance with embodiments of the present disclosure may operate with higher data storage capacity than when memory cells are configured as single level cells each storing one bit information. In addition, since 4 bit data stored in the three memory cells are read out by applying a first read voltage and a second read voltage to the memory cells, a memory device in accordance with an embodiment may operate with higher data reliability and higher write/read speeds than when memory cells are configured as mufti-level cells to which at least three read voltages are applied to detect 2 or more bit information stored in each cell.

While certain embodiments have been described above, it will be understood to those skilled in the art that the embodiments described above are for illustrative purposes. Accordingly, a nonvolatile memory apparatus and an operating method thereof described herein should not be limited to the embodiments described above.

What is claimed is:

1. A method for operating a nonvolatile memory apparatus, the method comprising:
   performing a first write operation to store first data in first to third memory cells; and performing a second write operation to store second data in the first to third memory cells in which the first data has been stored, wherein, as a result of the first write operation and the second write operation, each of the first to third memory cells has one of first to third states.

2. The method according to claim 1, wherein a number of bits of the first data is the same as a number of bits of the second data and smaller than a number of memory cells storing the first and second data, and wherein a sum of the number of bits of the first data and the number of bits of the second data is greater than the number of memory cells storing the first and second data.

3. The method according to claim 1, wherein performing the first write operation comprises:

controlling a state of each of the first to third memory cells to change from the first state to the third state or to remain in the first state, based on the first data.

4. The method according to claim 3, wherein performing the second write operation comprises:

controlling a state of at least one memory cell, which is in the first state, among the first to third memory cells so that it is changed to the second state or remains in the first state, based on the second data.

5. The method according to claim 1, wherein performing the second write operation comprises:

controlling a state of a memory cell, which is in the third state, among the first to third memory cells so that it remains in the third state.

6. The method according to claim 1, wherein a memory cell, which is in the third state, among the first to third memory cells has the highest threshold voltage, and a memory cell, which is in the first state, among the first to third memory cells has the lowest threshold voltage.

7. The method according to claim 1, wherein performing the first write operation comprises:

encoding the first data into first write data; and
controlling states of the first to third memory cells based on the first write data,
wherein the first write data has bits corresponding to the first to third memory cells.

8. The method according to claim 1, wherein performing the second write operation comprises:

encoding the second data into second write data based on the first data; and
controlling states of the first to third memory cells based on the second write data,
wherein the second write data has bits corresponding to the first to third memory cells.

9. The method according to claim 1, further comprising:

applying a first read voltage to the first to third memory cells;
loading first read data from the first to third memory cells; and
decoding the first read data into the first data.

10. The method according to claim 9, wherein the first read voltage is higher than a threshold voltage of a memory cell which is in the second state, and is lower than a threshold voltage of a memory cell which is in the third state.

11. The method according to claim 1, further comprising:

applying a second read voltage to the first to third memory cells;
loading second read data from the first to third memory cells; and
decoding the second read data into the second data.

12. The method according to claim 11, wherein the second read voltage is higher than a threshold voltage of a memory cell which is in the first state, and is lower than a threshold voltage of a memory cell which is in the second state.

13. The method according to claim 1, wherein each of the first and second data has 2 bits, and each of the first and second write data has 3 bits.

14. A nonvolatile memory apparatus, comprising:

a plurality of memory cells including first to third memory cells;
an encoder configured to encode first data into first write data and then encode second data into second write data; and
a control logic configured to control states of the first to third memory cells based on the first write data and control the states of the first to third memory cells based on the second write data,
wherein each of the first and second write data has bits corresponding to the first to third memory cells, and
wherein each of the first to third memory cells has one of first to third states after the states of the first to third memory cells are controlled based on the first and second write data.

15. The nonvolatile memory apparatus of claim 14, wherein each of the first and second data has 2 bits, and each of the first and second write data has 3 bits.

16. The nonvolatile memory apparatus of claim 14, wherein the control logic changes a state of one of the first to third memory cells from the first state to the third state or retains the first state in the first to third memory cells, based on the first write data.

17. The nonvolatile memory apparatus of claim 14, wherein the control logic changes a state of at least one memory cell, which is in the first state, among the first to third memory cells, to the second state, or retains the first state in the at least one memory cell, based on the second write data.

18. The nonvolatile memory apparatus of claim 14, wherein a memory cell, which is in the third state, among the first to third memory cells has the highest threshold voltage, and a memory cell, which is in the first state, among the first to third memory cells has the lowest threshold voltage, and wherein the control logic controls a state of a memory cell, which is in the third state, among the first to third memory cells to remain in the third state.

19. The nonvolatile memory apparatus of claim 14, further comprising:

a decoder configured to decode first read data from the first to third memory cells into the first data and decode second read data from the first to third memory cells into the second data,
wherein the first read data is output from the first to third memory cells by applying a first read voltage to the first to third memory cells, and
wherein the second read data is output from the first to third memory cells by applying a second read voltage to the first to third memory cells.

20. The nonvolatile memory apparatus of claim 19, wherein the first read voltage is higher than a threshold voltage of a memory cell which is in the second state, and is lower than a threshold voltage of a memory cell which is in the third state, and wherein the second read voltage is higher than a threshold voltage of a memory cell which is in the first state, and is lower than the threshold voltage of the memory cell which is in the second state.

* * * * *